United States Patent
Lee et al.

(10) Patent No.: US 7,181,857 B2
(45) Date of Patent: Feb. 27, 2007

(54) GEOMAGNETIC SENSOR FOR AUTO-CALIBRATION OF MAGNETIC FIELD DEVIATION AND METHOD OF USING THE SAME

(75) Inventors: Seung-wan Lee, Suwon-si (KR); Sang-on Choi, Suwon-si (KR)

(73) Assignee: Samsung Electronics Mechanics Co., Ltd., Gyeonggi-do (KR)

( * ) Notice: Subject to any disclaimer, the term of this patent is extended or adjusted under 35 U.S.C. 154(b) by 10 days.

(21) Appl. No.: 11/199,117

(22) Filed: Aug. 9, 2005

(65) Prior Publication Data

US 2006/0026849 A1    Feb. 9, 2006

(30) Foreign Application Priority Data

Aug. 9, 2004    (KR) .................. 10-2004-0062351

(51) Int. Cl.
*G01C 17/38* (2006.01)
*G01C 17/28* (2006.01)

(52) U.S. Cl. .......................................... 33/356; 33/361
(58) Field of Classification Search .......... 33/356, 33/361
See application file for complete search history.

(56) References Cited

U.S. PATENT DOCUMENTS

| | | | |
|---|---|---|---|
| 4,634,978 A | * | 1/1987 | Watanabe .................. 324/253 |
| 4,953,305 A | | 9/1990 | Van Lente et al. |
| 4,995,165 A | * | 2/1991 | Daniels ....................... 33/361 |
| 5,390,122 A | | 2/1995 | Michaels et al. |
| 6,407,547 B1 | * | 6/2002 | Yamada et al. ............. 324/253 |
| 6,972,563 B2 | * | 12/2005 | Goldenberg ................ 324/253 |
| 6,998,840 B2 | * | 2/2006 | Choi et al. .................. 324/253 |
| 2003/0173963 A1 | * | 9/2003 | Choi et al. .................. 324/253 |

* cited by examiner

*Primary Examiner*—Christopher W. Fulton
(74) *Attorney, Agent, or Firm*—Sughrue Mion, PLLC

(57) ABSTRACT

A geomagnetic sensor for auto-calibration of a deviation and a method of using the geomagnetic sensor. The geomagnetic sensor includes a geomagnetic detector including X-axis and Y-axis fluxgates orthogonal to each other and receiving a drive signal to detect an electromotive force corresponding to a geomagnetism, a signal processor converting the electromotive force output from the geomagnetic detector into X-axis and Y-axis output values and outputting the X-axis and Y-axis output values, and a drive signal generator applying the drive signal to the geomagnetic detector. Each of the X-axis and Y-axis fluxgates includes cores, a solenoid type exciting coil, and at least two detection coils winding around the cores in a solenoid form. Accordingly, as an azimuth is measured using output values detected by the separated detection coil, the azimuth can be exactly and easily detected regardless of an external magnetic field.

7 Claims, 4 Drawing Sheets

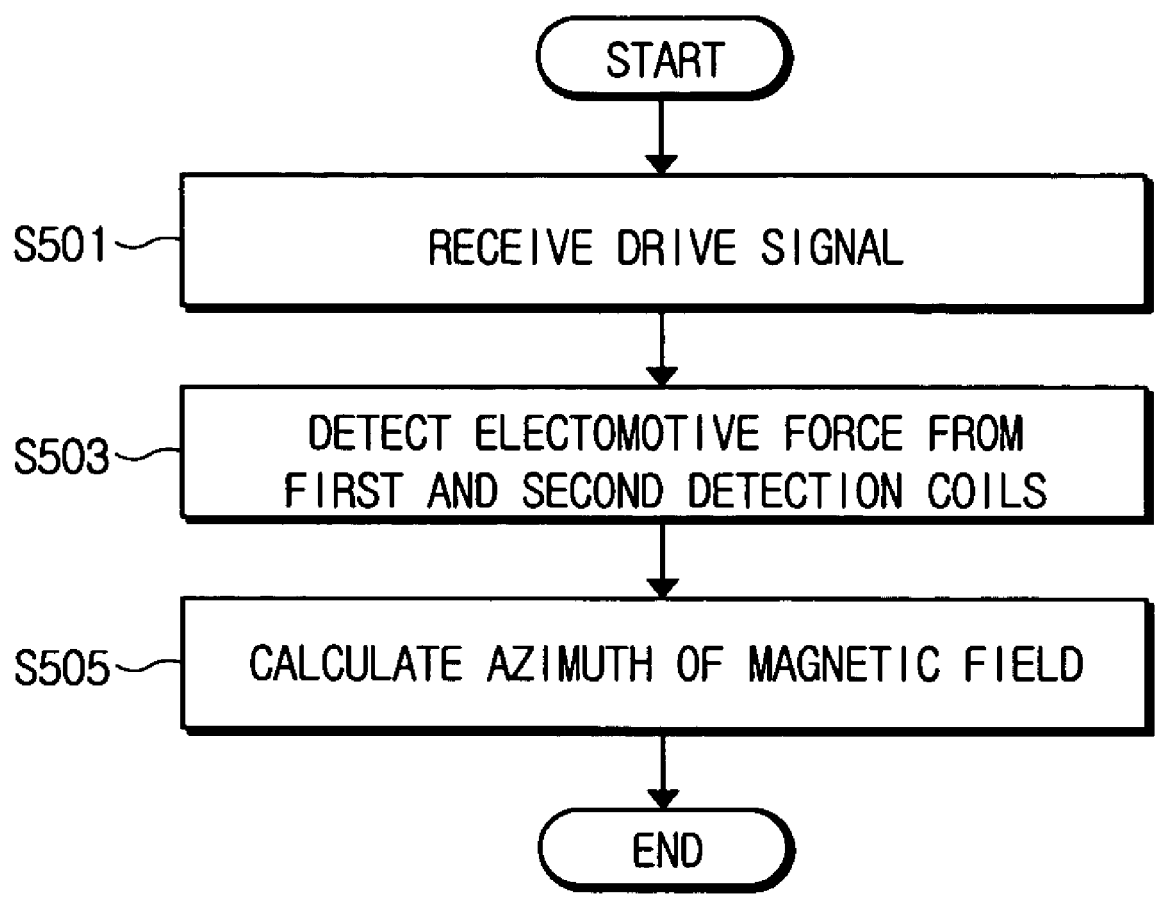

GEOMAGNETIC SENSOR FOR AUTO-CALIBRATION OF MAGNETIC FIELD DEVIATION AND METHOD OF USING THE SAME

CROSS-REFERENCE TO RELATED APPLICATIONS

This application claims the priority from Korean Patent Application No. 10-2004-0062351 filed on Aug. 9, 2004 in the Korean Intellectual Property Office, the disclosure of which is incorporated herein in its entirety by reference.

BACKGROUND OF THE INVENTION

1. Field of the Invention

Apparatuses and methods consistent with the present invention relate to using a geomagnetic sensor for auto-calibration of a deviation of a magnetic field, and more particularly, to a geomagnetic sensor for auto-calibration of a deviation of a magnetic field using a strength and an azimuth of the magnetic field calibrated using output values detected from separated detection coils and a method of using the same.

2. Description of the Related Art

A geomagnetic sensor measures a strength and a direction of a geomagnetism field. Examples of the geomagnetic sensor include a hole sensor using a hole effect, a superconducting quantum interference device (SQID) sensor using a quantization effect, a fluxgate type sensor using a saturation area of a magnetization curve, and the like.

The fluxgate type sensor is mostly used to measure a geomagnetism, in particular, to measure a geomagnetic field and detect minerals, space, the sea bottom, or the like. The fluxgate type sensor includes a soft magnetic property core formed of a high permeability material, an exciting coil winding around the soft magnetic property core, and a detection coil. The basic detection principle of the fluxgate type sensor uses non-linear magnetic characteristics saturating the soft magnetic property core by generating a magnetic field in the exciting coil using an alternating current and to measure the strength of an external magnetic field by measuring second harmonic voltage components proportional to the external magnetic field. The magnetic field detection method of the fluxgate type sensor includes second harmonic wave detection, pulse position detection, pulse magnitude detection, and so on. The second harmonic wave detection is mainly used.

With the recent development of Micro Electro Mechanical System (MEMS) technology, subminiature fluxgate type sensors consuming a small amount of power can be manufactured. Thus, such a subminiature fluxgate type sensor can be built in various potable electronic devices such as mobile phones, personal digital assistants (PDAs), notebook PCs, or the like.

FIG. 1 is a view illustrating a conventional fluxgate including a separate type exciting coil.

Referring to FIG. 1, the conventional fluxgate includes cores 5, an exciting coil 1 winding around the cores 5, and a detection coil 3 wining around the cores 5. The cores 5 are formed of a high permeability material and may be a single line type core, two parallel cores, a ring type core, or the like. Two parallel cores and the conventional fluxgate including one detection coil 3 are shown in FIG. 1. The exciting coil 1 winds around the cores 5 in the solenoid form and receives an electric drive signal from an external source to excite the cores 5. The detection coil 3 also winds around the cores 5 in the solenoid form and detects an electromotive force from a magnetism generated by driving of the exciting coil 1.

A geomagnetic sensor includes fluxgates to be orthogonal to each other as shown in FIG. 1. The fluxgates correspond to X-axis and Y-axis fluxgates. The geomagnetic sensor calculates a direction and strength of a magnetic field using output values output from the X-axis and Y-axis fluxgates. The strength of the magnetic field in a random position may be obtained by calculating an azimuth. When the azimuth is $\phi$, the azimuth $\phi$ is calculated as $\tan{-1}(Hy/Hx)$. Hx denotes the output value output from the X-axis fluxgate, and Hy denotes the output value output from the Y-axis fluxgate.

FIGS. 2A and 2B illustrate the results of detecting a calibrated magnetic field, and of detecting a magnetic field that is not affected by an external magnetic field and the magnetic field that is affected by the external magnetic field.

Referring to FIG. 2A, the strength of a magnetic field measured for X-axis and Y-axis fluxgates orthogonal to each other is calibrated, and the magnetic field forms a complete circle. A geomagnetic sensor system must 360° rotate to obtain the complete circle as shown in FIG. 2A.

Referring to FIG. 2B, the center of a circle obtained by detecting a magnetic field is displaced in a direction of an external magnetic field due to an effect of the external magnetic field, and thus coordinate axes are displaced. A direction of the measured geomagnetism varies depending on the environment. In other words, a geomagnetic sensor is easily affected by a peripheral magnetic field such as buildings, iron bridges, subways, or the like, and an output signal of the geomagnetic sensor greatly varies according to an assembled state, an inclined degree, or the measurement environment of the buildings, the iron bridges, the subways, or the like. In this case, the geomagnetic sensor requires a calibration operation to measure an exact azimuth. If the geomagnetic sensor is used without an appropriate calibration operation, an azimuth of a magnetic field may be changed sharply from $\Phi$ to $\Psi$ as shown in FIG. 2B. Although the center of the circle is moved by the affect of the external magnetic field, the movement of the center of the circle may not be calibrated. In this case, the direction of the magnetic field is detected as I not as II. Thus, in a case where the external magnetic field is not continuously calibrated, an azimuth of a geomagnetic field is distorted, and thus the reliability of data is deteriorated. The center of the circle must be moved from point C to point C' in direction III to calibrate the effect of the external magnetic field. For such a calibration, the geomagnetic sensor system must be rotated to detect output values of X and Y axes of the circle that is affected by the external magnetic field, so as to detect the center of the moved circle.

U.S. Pat. No. 4,953,305 discloses a system including a magnetic sensor and a microprocessor used for a vehicle in which a magnetic field is measured on X and Y axes, and a displacement of coordinate axes of a detected magnetic field exceeding a detection restriction area due to an external magnetic field is automatically calibrated. However, in a calibration method disclosed in U.S. Pat. No. 4,953,305, a slight variation in the direction of a geomagnetism due to a variation in the environment may be calibrated but a severe variation may not be calibrated. The disclosed calibration method varies with each vehicle. Also, before a geomagnetic system is mounted in the vehicle, a variation in the direction of a geomagnetism may not be calibrated. Even after the geomagnetic system is mounted in the vehicle, the vehicle must rotate 360° several times in order to calibrate the variation.

When the vehicle rotates several times to calibrate the variation, a substantial user environment hardly exists in a space for rotating the vehicle. Thus, corrected data must be compared with initial corrected data to determine whether the corrected data is re-corrected, so as to improve a calibration process with a sufficient rotation. Thus, U.S. Pat. No. 5,390,122 discloses a method of operating an auto-calibration system when a system including a geomagnetic sensor moves at a speed of 16 km/h. As disclosed in U.S. Pat. No. 5,390,122, a vehicle is not rotated for calibration, but re-corrected data is compared with initial corrected data. However, data appropriate for calibrating the geomagnetic sensor may not be obtained according to proper circumstances.

SUMMARY OF THE INVENTION

Accordingly, the present general inventive concept has been made to solve the above-mentioned problems, and an aspect of the present general inventive concept is to provide a geomagnetic sensor for auto-calibration of a deviation of a magnetic field, for measuring a direction and a strength of the magnetic field regardless of an effect of an external magnetic field using X-axis and Y-axis output values detected from separate detection coils of a fluxgate, and a method using the geomagnetic sensor.

According to an aspect of the present invention, there is provided a geomagnetic sensor for auto-calibration of a deviation of a magnetic field, including: a geomagnetic detector including X-axis and Y-axis fluxgates orthogonal to each other and receiving a drive signal to detect an electromotive force corresponding to a geomagnetism; a signal processor converting the electromotive force output from the geomagnetic detector into X-axis and Y-axis output values and outputting the X-axis and Y-axis output values; and a drive signal generator applying the drive signal to the geomagnetic detector. Each of the X-axis and Y-axis fluxgates of the geomagnetic detector includes cores; a solenoid type exciting coil receiving the drive signal to excite the cores; and at least two detection coils winding around the cores in a solenoid form so as to detect the electromotive force induced by the cores and the exciting coil and having different numbers of turns.

The geomagnetic sensor may further include a controller calculating an azimuth $\phi$ based on the X-axis and Y-axis output values output from the signal processor.

The azimuth $\phi$ may be calculated from the following equation:

$$\phi = \tan^{-1} \frac{X22 - X21}{Y22 - Y21}$$

wherein X21 and Y21 are X-axis and Y-axis output values that are not affected by an external magnetic field and detected by one of the at least two detection coils, and X22 and Y22 are X-axis and Y-axis output values that are affected by the external magnetic field and detected by the other one of the at least two detection coils.

Each of the X-axis and Y-axis fluxgates may include the at least two detection coils, the numbers of turns of which are in a ratio of about 1:2.

According to another aspect of the present invention, there is provided a method of auto-calibration of a deviation of a magnetic field of a geomagnetic sensor including X-axis and Y-axis fluxgates orthogonal to each other and each including at least two detection coils detecting an electromotive force corresponding to a geomagnetism, including: applying a drive signal to each of the X-axis and Y-axis fluxgates; detecting the electromotive force induced to the X-axis fluxgate from the at least two detection coils according to the drive signal and converting the electromotive force into predetermined X-axis output values; detecting the electromotive force induced to the Y-axis fluxgate from the at least two detection coils according to the drive signal and converting the electromotive force into predetermined Y-axis output values; and calculating a direction and a strength of a magnetic field based on a gradient of a straight line linking two of points on coordinates corresponding to the X-axis and Y-axis output values.

Each of the X-axis and Y-axis fluxgates may include the at least two detection coils, of which the numbers of turns are in a ratio of about 1:2.

The strength of the magnetic field may be calculated using an azimuth $\phi$ calculated from the following equation:

$$\phi = \tan^{-1} \frac{X22 - X21}{Y22 - Y21}$$

wherein X21 and Y21 are X-axis and Y-axis output values that are not affected by an external magnetic field and detected by one of the at least two detection coils, and X22 and Y22 are X-axis and Y-axis output values that are affected by the external magnetic field and detected by the other one of the at least two detection coils.

BRIEF DESCRIPTION OF THE DRAWINGS

The above and other aspects of the present invention will be more apparent by describing exemplary embodiments of the present invention with reference to the accompanying drawings, in which:

FIG. 5 is a flowchart of a method of auto-calibration of a deviation of a geomagnetic field according to an exemplary embodiment of the present invention.

DETAILED DESCRIPTION OF EXEMPLARY EMBODIMENTS OF THE INVENTION

Figure 1:
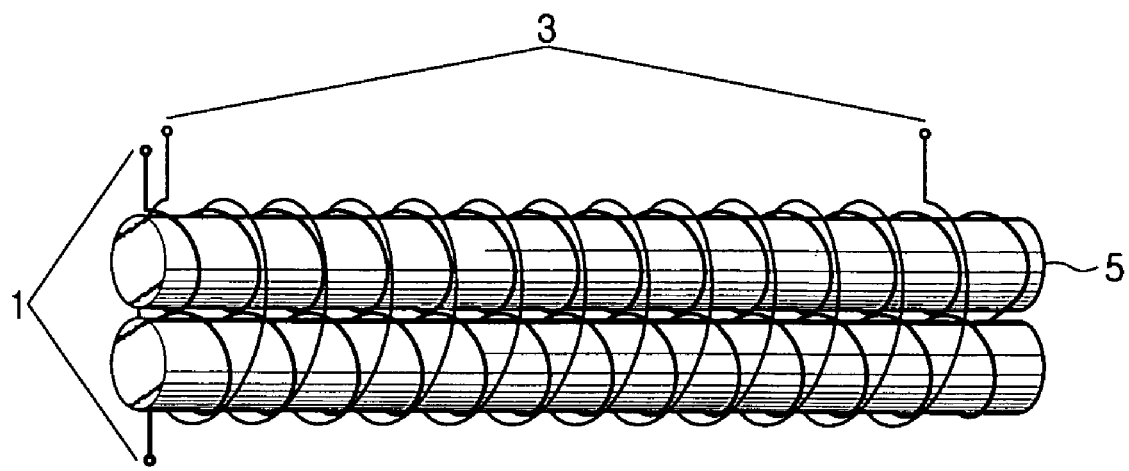
FIG. 1 illustrates a conventional fluxgate including a separate type exciting coil.
Figure 2A:
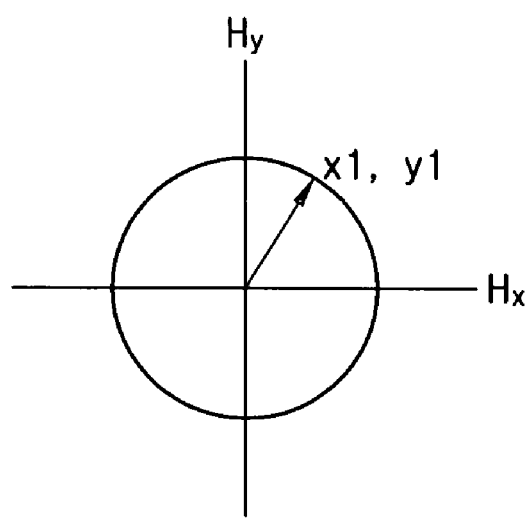
FIGS. 2A and 2B illustrate the results of detecting a calibrated magnetic field, and detecting a magnetic field that is not affected by an external magnetic field and the magnetic field that is affected by the external magnetic field.
Figure 2B:
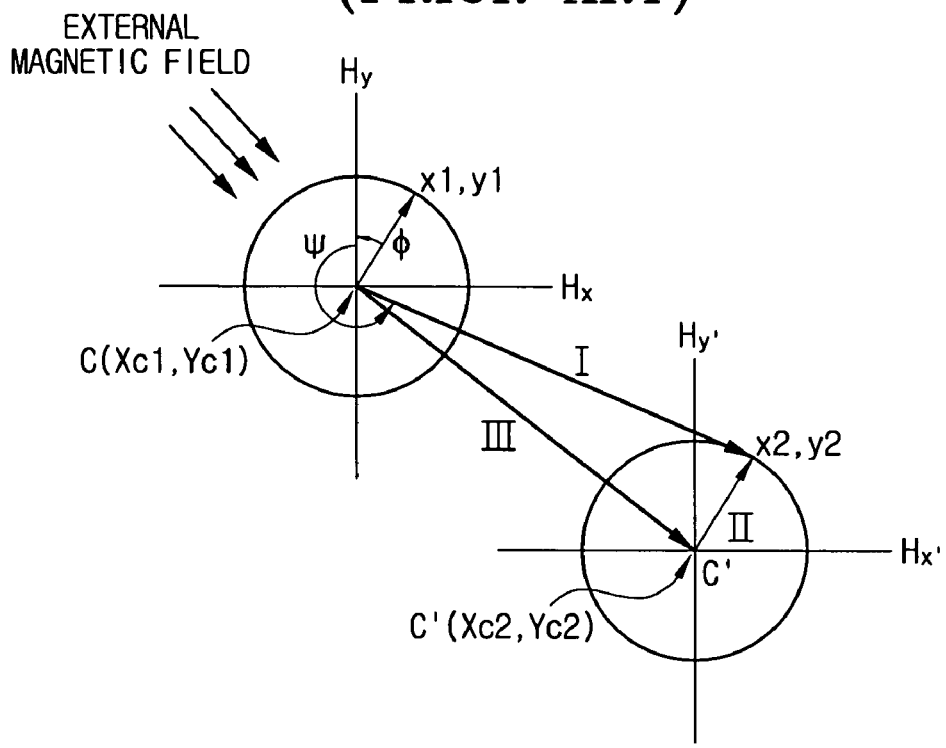

Exemplary embodiments of the present invention will be described in greater detail with reference to the accompanying drawings.

In the following description, same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 3A:
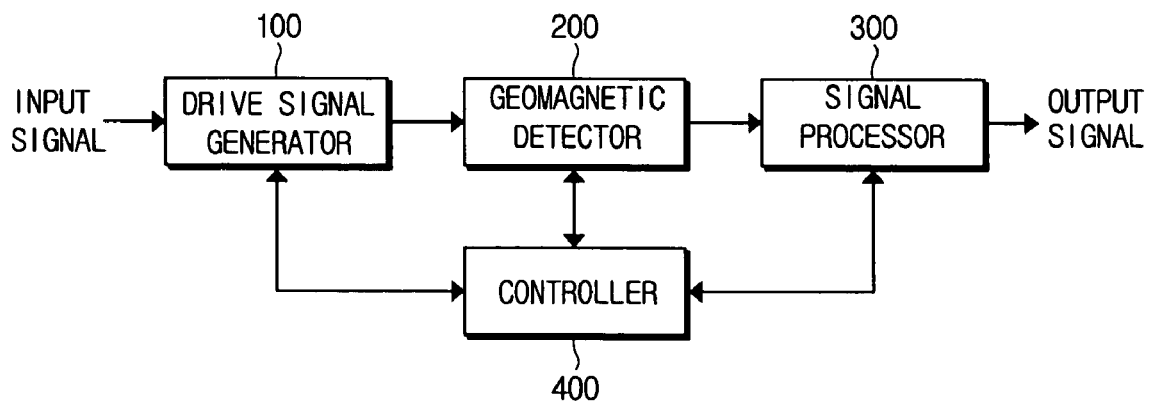
FIG. 3A is a block diagram of a geomagnetic sensor according to an exemplary embodiment of the present invention.

FIG. 3A is a block diagram of a geomagnetic sensor according to an exemplary embodiment of the present invention. Referring to FIG. 3A, the geomagnetic sensor includes a drive signal generator 100, a geomagnetic detector 200, a signal processor 300, and a controller 400.

The drive signal generator 100 generates and outputs a drive signal for driving the geomagnetic detector 200. The drive signal generally uses a pulse wave and a reversed pulse wave of the pulse wave.

The geomagnetic detector 200 receives the drive signal from the drive signal generator 100 and outputs a predetermined electric signal corresponding to a geomagnetism. The geomagnetic detector 200 includes X-axis and Y-axis fluxgates orthogonal to each other.

The signal processor 300 performs processing on the predetermined electric signal output from the geomagnetic detector 200 to convert the predetermined electric signal into a predetermined digital value, and outputs the digital value.

The controller 400 controls components of the geomagnetic sensor and operates an azimuth using output values detected by the X-axis and Y-axis fluxgates.

Figure 3B:
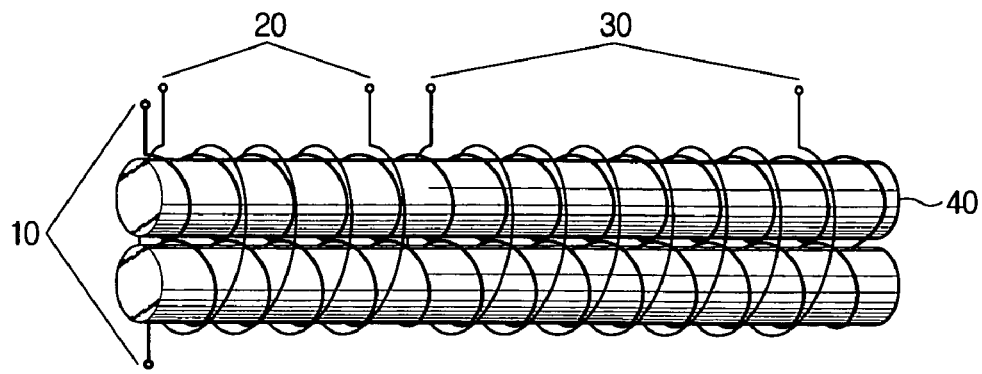
FIG. 3B illustrates a part of a geomagnetic detector of the geomagnetic sensor shown in FIG. 3A.

FIG. 3B is a view of a part of the geomagnetic detector 200 of the geomagnetic sensor shown in FIG. 3A, that is, one of the X-axis and Y-axis fluxgates of the geomagnetic detector 200. The fluxgate of the geomagnetic detector 200 shown in FIG. 3B includes two detection coils, that is, first and second detection coils 20 and 30, but may include two or more detection coils.

Referring to FIG. 3B, each of the X-axis and Y-axis fluxgates of the geomagnetic detector 200 includes an exciting coil 10, the first and second detection coils 20 and 30, and cores 40.

The cores 40 are formed of a high magnetic permeability material and wounded by the exciting coil 10 and the first and second detection coils 20 and 30. A magnetic field is formed in the cores 40 by the exciting coil 10 upon receiving the drive signal.

The exciting coil 10 receives the drive signal from the drive signal generator 100 to excite the cores 40 formed of a magnetic material. Directions of two portions of the exciting coil 10 winding around the cores 40 are opposite to each other according to the cores 40 that are parallel up and down. Thus, the magnetic field is formed in an opposite direction at the cores 40 excited by the exciting coil 10 receiving the drive signal.

When the drive signal is applied to the exciting coil 10, an electromotive force proportional to a strength of an external magnetic field is induced to the first and second detection coils 20 and 30. The electromotive force is detected from the first and second detection coils 20 and 30 of each of the X-axis and Y-axis fluxgates. The electromotive force induced to the first and second detection coils 20 and 30 is input to the signal processor 300. Directions along which the first and second detection coils 20 and 30 are formed may be the same or opposite. In a case where the directions along which the first and second detection coils 20 and 30 are formed are the same, points on coordinates formed by X-axis and Y-axis output values detected from the first and second detection coils 20 and 30 are positioned in the same direction based on the origin. In a case where the directions along which the first and second coils 20 and 30 are formed are opposite, the points on the coordinates formed by the X-axis and Y-axis output values detected from the first and second detection coils 20 and 30 are positioned in opposite directions based on the origin. The number of turns of the first detection coil 20 and the number of turns of the second detection coil 30 are in the ratio of 1:2. However, the ratio of the numbers of turns of the first and second detection coils 20 and 30 may vary.

Figure 4:
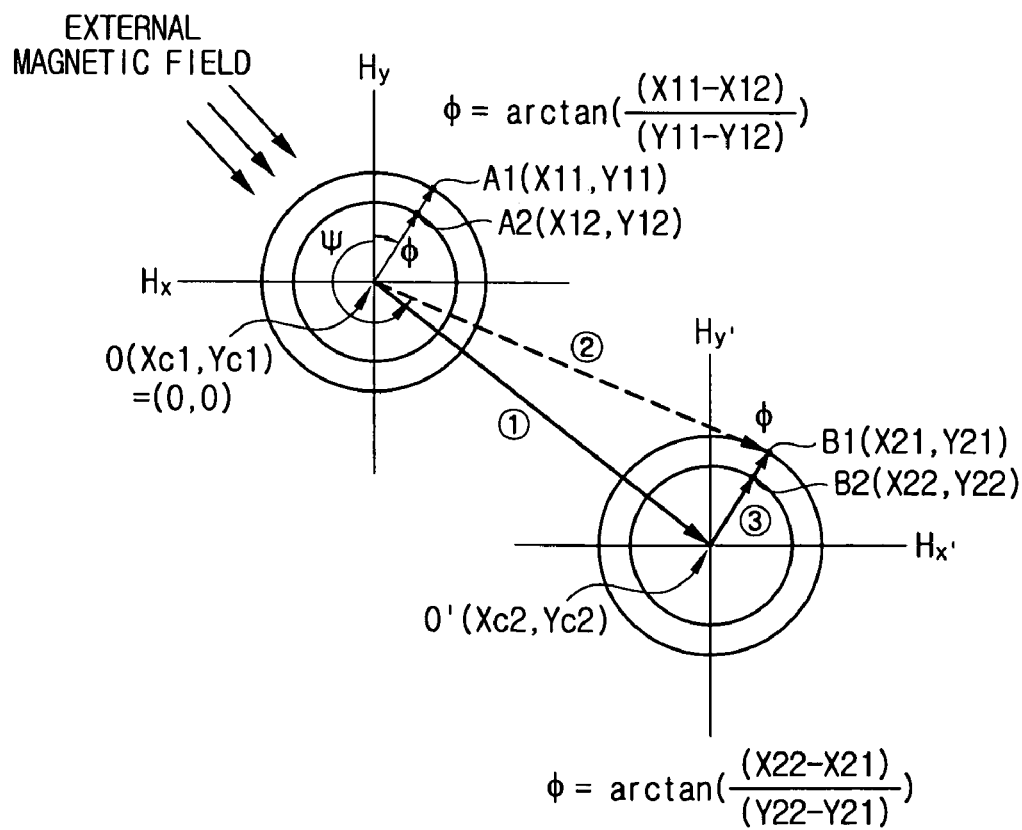
FIG. 4 illustrates X-axis and Y-axis output values and an azimuth detected by the geomagnetic sensor as shown in FIG. 3A.

FIG. 4 illustrates X-axis and Y-axis output values and an azimuth detected by a geomagnetic sensor according to an exemplary embodiment of the present invention. X-axis and Y-axis output values and an azimuth that are not affected by an external magnetic field are represented on coordinates of Hx and Hy axes. X-axis and Y-axis output values and an azimuth that are affected by the external magnetic field are represented on coordinates of Hx' and Hy' axes. Outer circles denote X-axis and Y-axis output values detected by the first detection coil 20, and inner circles denote X-axis and Y-axis output values detected by the second detection coil 30.

$\Phi$ denotes an azimuth, and $\psi$ denotes an angle by which the center of the X-axis and Y-axis output values is moved by the external magnetic field. (Xc1, Yc1) and (Xc2, Yc2), respectively, are centers represented before and after the effect of the external magnetic field. X11 and Y11, and X12 and Y12 are the X-axis and Y-axis output values detected by the first and second detection coils 20 and 30 before the effect of the external magnetic field. X21 and Y21, and X22 and Y22 are the X-axis and Y-axis output values detected by the first and second detection coils 20 and 30 after the effect of the external magnetic field.

Referring to FIG. 4, when output values detected by the first and second detection coils 20 and 30 are represented on X and Y axes, two points of vectors with different sizes in the same direction, that is, A1 and A2 or B1 and B2, are obtained. A1 and A2 are points on X-axis and Y-axis coordinates represented before the effect of the external magnetic field, and B1 and B2 are points on the X-axis and Y-axis coordinates represented after the effect of the external magnetic field.

A direction of a magnetic field that is not affected by the external magnetic field is a gradient of a straight line linking the origin O to the point A1, and the gradient of the straight line linking the origin O to the point A1 is equal to a gradient of a straight line linking the points A1 and A2. The direction of the magnetic field that is affected by the external magnetic field is a gradient of a straight line linking the origin O' moved by the external magnetic field to the point B1, and the gradient is equal to a gradient of a straight line linking the points B1 and B2 detected by the first and second detection coils 20 and 30. The points A1 and A2 are relatively moved to the points B1 and B2 due to the effect of the external magnetic field. Thus, the gradient of the straight line linking the points A1 and A2 is equal to the gradient of the straight line linking the points B1 and B2. As a result, although the moved origin O' is not obtained by rotating and calibrating the geomagnetic sensor, the direction and strength of the magnetic field can be obtained using only the X-axis and Y-axis output values detected by the first and second detection coils 20 and 30 that are separated from each other.

Since a direction of a geomagnetic field does not vary before and after the effect of the external magnetic field, an azimuth of the magnetic field may be obtained regardless of the direction of the external magnetic field.

The azimuth of the magnetic field that is not affected by the external magnetic field can be represented using the X-axis and Y-axis output values detected by two detection coils as in Equation 1:

$$\phi = \tan^{-1} \frac{X11 - X12}{Y11 - Y12} \quad \text{[Equation 1]}$$

In Equation 1, X11 and Y11 are the X-axis and Y-axis output values that are not affected by the external magnetic field and detected by the first detection coil 20, and X12 and Y12 are the X-axis and Y-axis output values that are not affected by the external magnetic field and detected by the second detection coil 30.

The azimuth of the magnetic field that is affected by the external magnetic field can be represented using the X-axis and Y-axis output values detected by the two detection coils as in Equation 2:

$$\phi = \tan^{-1} \frac{X22 - X21}{Y22 - Y21} \quad \text{[Equation 2]}$$

In Equation 2, X21 and Y21 are the X-axis and Y-axis output values that are affected by the external magnetic field and detected by the first detection coil 20, and X22 and Y22 are the X-axis and Y-axis output values that are affected by the external magnetic field and detected by the second detection coil 30.

As shown in Equations 1 and 2, the azimuth of the magnetic field is an arc tangent value of a gradient of a straight line linking two points detected by the first and second detection coils 20 and 30. Thus, the result of Equation 1 is equal to the result of Equation 2. As described above, the gradient of the straight line linking the two points on the coordinates represented by the X-axis and Y-axis output values that are not affected by the external magnetic field and detected by the first and second detection coils 20 and 30 is equal to the gradient of the straight line linking the two points on the coordinates represented by the X-axis and Y-axis output values that are affected by the external magnetic field and detected by the first and second detection coils 20 and 30. Thus, the azimuth of the magnetic field does not vary irrespective of the external magnetic field.

As shown in FIG. 4, the directions along which the first and second detection coils 20 and 30 are formed are the same. Thus, points on coordinates represented by output values detected by the first detection coil 20 and points on coordinates represented by output values detected by the second detection coil 30 are formed as vectors in the same direction in a first quadrant on coordinates based on the origin.

FIG. 5 is a flowchart of a method of auto-calibration of a deviation of a geomagnetic field according to an exemplary embodiment of the present invention.

Referring to FIG. 5, in operation S501, the exciting coil 10 receives the drive signal from the drive signal generator 100. The exciting coil 10 excites the cores 40 of the geomagnetic detector 200. When the exciting coil 10 receives the drive signal and the cores 40 are excited, the electromotive force proportional to the strength of the external magnetic field is induced to the first and second detection coils 20 and 30.

In operation S503, the electromotive force proportional to the strength of the external magnetic field is detected from the first and second detection coils 20 and 30. The electromotive force induced to the first and second detection coils 20 and 30 are output to the signal processor 300. The signal processor 300 performs the predetermined processing on the electric signal detected by the first and second detection coils 20 and 30 to convert the electric signal into the predetermined digital value.

In operation S505, the direction and azimuth of the magnetic field are calculated using the electric signal detected by the first and second detection coils 20 and 30. The X-axis and Y-axis output values detected by the first and second detection coils 20 and 30 and moved by the external magnetic field are used without having to detect the origin moved by the external magnetic field in the circle representing the X-axis and Y-axis output values. The gradient of the straight line linking two points on the coordinates represented by the output values detected by the first and second detection coils 20 and 30 relatively moved by the effect of the external magnetic field is equal to the gradient that is not affected by the external magnetic field. Thus, the direction and azimuth of the magnetic field are detected by calculating a gradient of a straight line linking two points represented by output values detected by the first and second detection coils 20 and 30, not by calculating the azimuth using a gradient of a straight line linking the origin to a point on coordinates represented by the output values detected by the first detection coil 20 or a gradient of a straight line linking the origin to a point on coordinates represented by the output values detected by the second detection coil 30. The method of detecting the direction and azimuth of the magnetic field are as described with reference to FIG. 4.

The azimuth is calculated by the controller 400 using the output values detected by the first and second detection coils 20 and 30 as in Equation 2 above.

As described above, a geomagnetic sensor for auto-calibration of deviation and a method of using the same according to the present invention, detection coils of a geomagnetic detector can be separated from each other. An azimuth can be measured using output values detected by the separated detection coils. As a result, the azimuth can be exactly and easily detected regardless of an external magnetic field.

The foregoing exemplary embodiments and aspects are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A geomagnetic sensor for auto-calibration of a deviation of a magnetic field, comprising:
    a geomagnetic detector which includes X-axis and Y-axis fluxgates orthogonal to each other and receives a drive signal to detect an electromotive force corresponding to a geomagnetism;
    a signal processor which converts the electromotive force output from the geomagnetic detector into X-axis and Y-axis output values and outputs the X-axis and Y-axis output values; and
    a drive signal generator which applies the drive signal to the geomagnetic detector,
    wherein each of the X-axis and Y-axis fluxgates of the geomagnetic detector comprises:
    cores;
    a solenoid type exciting coil which receives the drive signal to excite the cores; and
    at least two detection coils which wind around the cores in a solenoid form so as to detect the electromotive force induced by the cores and the exciting coil and which have different numbers of turns.

2. The geomagnetic sensor of claim 1, further comprising a controller calculating an azimuth φ based on the X-axis and Y-axis output values output from the signal processor.

3. The geomagnetic sensor of claim 2, wherein the azimuth φ is calculated using the following equation:

$$\phi = \tan^{-1}\frac{X22 - X21}{Y22 - Y21}$$

wherein X21 and Y21 are X-axis and Y-axis output values that are not affected by an external magnetic field and detected by one of the at least two detection coils, and X22 and Y22 are X-axis and Y-axis output values that are affected by the external magnetic field and detected by another one of the at least two detection coils.

4. The geomagnetic sensor of claim 1, wherein each of the X-axis and Y-axis fluxgates comprises the at least two detection coils, of which numbers of turns are in a ratio of about 1:2.

5. A method of auto-calibration of a deviation of a magnetic field of a geomagnetic sensor comprising X-axis and Y-axis fluxgates orthogonal to each other and each comprising at least two detection coils which detect an electromotive force corresponding to a geomagnetism, the method comprising:
 (a) applying a drive signal to each of the X-axis and Y-axis fluxgates;
 (b) detecting the electromotive force induced to the X-axis fluxgate from the at least two detection coils according to the drive signal and converting the electromotive force into predetermined X-axis output values;
 (c) detecting the electromotive force induced to the Y-axis fluxgate from the at least two detection coils according to the drive signal and converting the electromotive force into predetermined Y-axis output values; and
 (d) calculating a direction and a strength of a magnetic field based on a gradient of a straight line linking two of points on coordinates corresponding to the X-axis and Y-axis output values.

6. The method of claim 5, wherein each of the X-axis and Y-axis fluxgates comprises the at least two detection coils, of which numbers of turns are in a ratio of about 1:2.

7. The method of claim 5, wherein the strength of the magnetic field is calculated using an azimuth φ calculated using the following equation:

$$\phi = \tan^{-1}\frac{X22 - X21}{Y22 - Y21}$$

wherein X21 and Y21 are X-axis and Y-axis output values that are not affected by an external magnetic field and detected by one of the at least two detection coils, and X22 and Y22 are X-axis and Y-axis output values that are affected by the external magnetic field and detected by another one of the at least two detection coils.

* * * * *